United States Patent [19]

Scarlett

[11] Patent Number: 4,572,925

[45] Date of Patent: Feb. 25, 1986

[54] PRINTED CIRCUIT BOARDS WITH SOLDERABLE PLATING FINISHES AND METHOD OF MAKING THE SAME

[75] Inventor: John A. Scarlett, Galashiels, Scotland

[73] Assignee: Standard Telephones and Cables Public Limited Company, London, England

[21] Appl. No.: 589,025

[22] Filed: Mar. 13, 1984

[30] Foreign Application Priority Data

Mar. 15, 1983 [GB] United Kingdom ............... 8307142

[51] Int. Cl.[4] .......................... H05K 1/09; H05K 3/06
[52] U.S. Cl. ................................... 174/68.5; 29/846; 29/852; 427/97
[58] Field of Search ............... 174/68.5; 29/852, 846; 427/97

[56] References Cited

U.S. PATENT DOCUMENTS

| | | | |
|---|---|---|---|
| 4,075,416 | 2/1978 | Küttner et al. ................... | 174/68.5 |
| 4,104,111 | 8/1978 | Mack .............................. | 174/68.5 X |
| 4,135,988 | 1/1979 | Dugan et al. .................... | 427/97 |
| 4,285,991 | 8/1981 | Gedrat et al. ................... | 427/97 |
| 4,440,823 | 4/1984 | Hoffmann ........................ | 174/68.5 X |
| 4,444,619 | 4/1984 | O'Hara ........................... | 174/68.5 X |
| 4,512,829 | 4/1985 | Ohta et al. ..................... | 29/852 |

FOREIGN PATENT DOCUMENTS

| | | |
|---|---|---|
| 978793 | 8/1962 | United Kingdom . |
| 1194894 | 6/1967 | United Kingdom . |
| 1224953 | 8/1969 | United Kingdom . |
| 1409737 | 10/1975 | United Kingdom ........... 427/97 |
| 2017416 | 2/1979 | United Kingdom . |
| 2051489 | 5/1980 | United Kingdom . |

OTHER PUBLICATIONS

Published International Application PCT/US78/00055; WO79/00083; Feb. 1979.

*Primary Examiner*—A. T. Grimley
*Assistant Examiner*—Morris H. Nimmo
*Attorney, Agent, or Firm*—Kerkam, Stowell, Kondracki & Clarke

[57] ABSTRACT

Printed circuit manufacture may employ a plated palladium-nickel alloy layer as an etch resist and plating finish. Prior to the use of palladium-nickel, tin-lead was used as the etch resist and plating finish. The palladium-nickel layer is generally superior to the corresponding tin-lead layer except for solderability. To improve the solderability of at least these areas of the palladium-nickel to which elements are to be soldered, a layer of copper is deposited thereon. If desired, the solderability of the copper may be preserved by coating it with, for example, a tin-lead layer.

12 Claims, 12 Drawing Figures

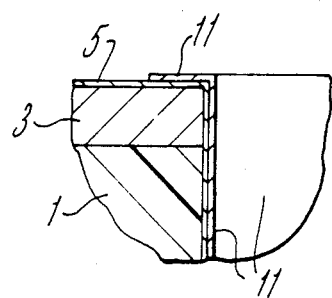
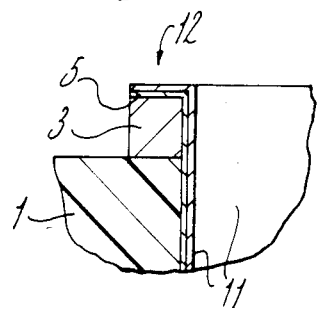
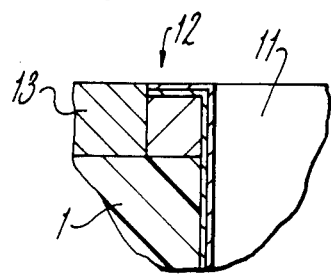
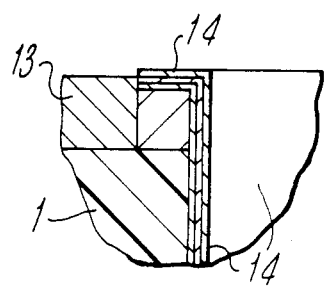
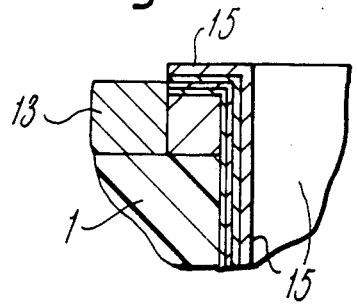
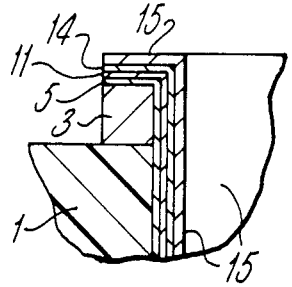

PRINTED CIRCUIT BOARDS WITH SOLDERABLE PLATING FINISHES AND METHOD OF MAKING THE SAME

BACKGROUND OF THE INVENTION

This invention relates to printed circuits and methods of making them and, in particular, to solerable plating finishes therefor.

Many printed circuit boards with plated through holes, copper being plated onto the walls (barrels) of the holes, are made using a plate-on metal finish as an etch resist. This metal finish is plated on using a resist coating (photo-resist) which covers the areas of the board which will not form tracks or pads. The plated-on metal finish thus forms the final coating for the tracks, pads and barrels of the holes. After the metal has been plated and the resist coating is removed from the board, and the original copper cladding of the board, and any further copper plated over it, are etched away from the area which are not tracks or pads and are thus not protected by the plated-on metal finish etch resist.

The two main requirements for such a plated-on etch resist are that it should be resistant to as wide a variety of commonly used etchants for copper as possible and that it should be readily solderable. The use of metal which can form a thin, pore-free coating is desirable, as is low cost. Considerable saving in processing costs may be achievable if a plated-on metal etch resist, having sufficient corrosion resistance, low enough resistance, could be employed to also form a contact surface of an edge connector finger of the printed circuit board, or to form the underlay plating for a final coating of a thin layer of another metal, often gold, over an edge connector finger.

Gold has been used as an etch-resist/surface-finish plating, but its use can cause problems in solder joints due to gold embrittlement, and its cost makes use as an overall finish undersirable. Most metal-finished through-hole plated boards are, therefore, given a plated-on tin-lead alloy finish. This is obviously solderable and is resistant to many etchants, but it has some disadvantages. The coating has to be fairly thick, some 10 microns, to form a good resist and to avoid the formation of unsolderable copper-tin intermetallic compounds over the board surface. During etching, the etchant eats away the sides of the tracks and pads, leaving a small width of the tin-lead plating overhanging. This can break away to form slivers which can cause unwanted short circuits. Such overhang slivers are usually removed from new boards by melting the tin-lead in a reflowing process which allows it to flow over the sides of the tracks. In addition, tin-lead plating cannot be used as an underplate for gold edge connector fingers. Thus when gold plating is required at least the board edge must be masked, after tin-lead plating, apart from the edge connector fingers so that the tin-lead can be stripped therefrom, by dipping in a suitable medium, before the gold and any underplating of nickel, or other suitable metal, is applied. A further disadvantage of tin-lead as an etch resist and overall finish is that if a solder resist pattern is applied to a board over the tin-lead on the tracks, this solder resist is liable to crack as the board is wave or drag soldered and the tin-lead beneath the resist melts.

All of these disadvantages of tin-lead plating can be overcome by the recently proposed use of palladium-nickel, or other nickel alloys such as tin-nickel, as the etch resist. The nickel alloys can be plated to form very thin pore-free coatings. These coatings are so thin that they lack the mechanical strength to form slivers as the etchant undercuts the etch resist plating. They also form an excellent underplate for thin gold contact (edge connector) fingers, and they do not melt and flow beneath a solder resist coating.

However, nickel and its alloys are not easy to solder to, and may require the use of an activated flux to achieve good joints. Activated fluxes can leave corrosive residues and thus their use may be undesirable in many applications.

SUMMARY OF THE INVENTION

It is, therefore, an object of the present invention to overcome the power solderability of nickel alloy etch resist while retaining all of their advantages over the conventional tin-lead etch.

According to one aspect of the present invention there is provided a printed circuit comprising conductive areas including a nickel-alloy layer, which during manufacture of the circuit comprised an etch resist, a copper layer being provided on the nickel-alloy layer on at least one of said areas whereby to facilitate soldering of an element to said at least one area.

According to another aspect of the present invention there is provided a method of manufacturing a printed circuit including the steps of selectively plating areas of a metal-coated insulating substrate with a nickel alloy, which nickel alloy is to act as an etch resist; etching the metal from the substrate except where it is protected by the nickel alloy, or by another etch resistant layer; and depositing copper on at least one of said nickel alloy plated areas whereby to facilitate subsequent soldering of an element thereto.

BRIEF DESCRIPTION OF THE DRAWINGS

The invention will be better understood from a reading of the following detailed description in conjunction with the drawings in which:

FIGS. 3 to 12 are views corresponding to FIG. 2, illustrating successive stages in the manufacture of a through-hole plated printed circuit board in accordance with an embodiment of the present invention.

DETAILED DESCRIPTION

Figure 1:
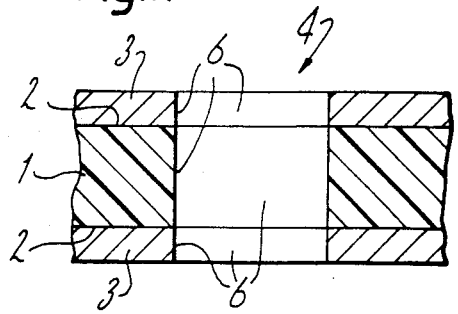
FIG. 1 is a section through part of a substrate of insulating material coated on each of its two faces with a layer of copper, the section being taken across a hole through the substrate and through each metal layer.
Figure 2:
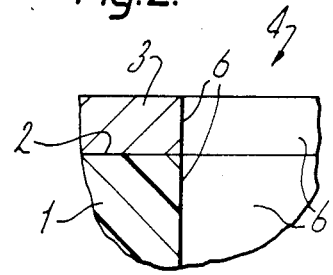
FIG. 2 is an enlarged view of part of FIG. 1.

Illustrated in FIG. 1 of the drawings is a printed circuit board substrate 1, of glass fiber-filled plastics material, for example, initially coated on each of the two faces 2 with a respective first layer 3 of copper. Holes 4, of which only one is shown, each extend through both layers 3 and the substrate 1.

Figure 3:
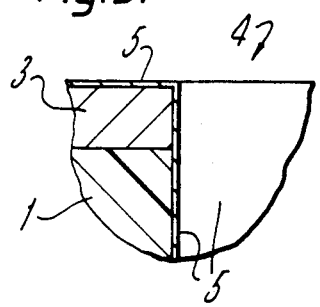

To fabricate a through-hole plated circuit in accordance with a preferred form of the invention, the first step is to plate a second layer 5 of copper as shown in FIG. 3 over each first layer 3 and over the wall 6 of each hole 4. This second layer 5 may comprise a very thin electrode-lessly plated layer or a very thin electrode-lessly plated layer plus a thicker electro-plated layer. By electrode-lessly plated copper layer is meant a copper layer deposited from a solution by an electrode-less reduction process.

Figure 4:
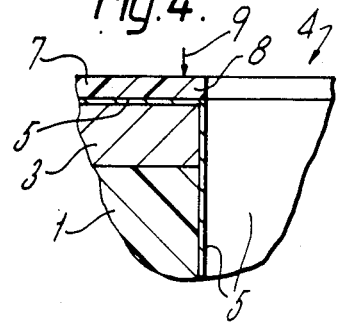
Figure 5:
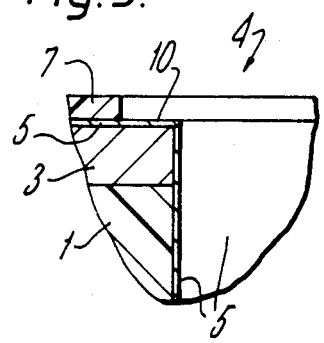

The next step, as shown in FIG. 4, is to apply a layer 7 of positive photo-resist, unexposed as yet to light, over the first and second copper layers 3 and 5, but not over the wall 6 of each hole 4. This can be done by roller-coating. The next, two stage, step is to expose to light discrete portions 8 (FIG. 4) of layer 7, up to arrow 9, for example, in the region of each hole 4, using a photo-mask (not shown) which bears a "negative" pattern of the required pads, tracks and edge connector areas, and then to remove the exposed portions 8 by "developing" them and dissolving them away so that discrete portions of layer 5 are uncovered, such as portion 10 uncovered in the region of each hole 4, both on each substrate face 2 and on the hole wall 6, as shown in FIG. 5.

Figure 6:
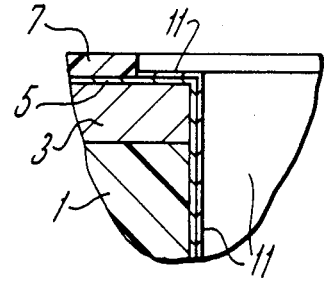

The thus-exposed copper areas are then plated with palladium-nickel or another nickel alloy capable of forming a very thin pore-free layer 11 on copper as an etch resist (FIG. 6). The remaining photo-resist 7 is removed (FIG. 7) and the board etched. The tracks and pads are thus defined by etching away the copper layers 3 and 5 where they are unprotected by the layer 11, using an etchant which attacks copper but not the layer 11 or the substrate 1. FIG. 8 only illustrates a palladium-nickel "pad" 12 surrounding a hole 4, the plating and etching processes however, also provide palladium-nickel plated tracks and edge connector areas which are not shown in FIG. 8.

The etched board is then provided with a suitable solder resist 13 (FIG. 9) which may comprise, for example, dry film, stoved epoxy (screened) or UV cured epoxy (screened), applied in such a manner as to leave exposed all of the pads which are to be soldered and the hole barrels. The solder-resist coated board is then cleaned and immersed in an autocatalytic electroless copper plating solution, which deposits a thin, adherent layer 14 (FIG. 10) of the copper over all the exposed nickel alloy surfaces. If gold plated edge connectors are required the solder resist is applied such as to extend over corresponding nickel alloy surfaces. In dependence on the solution used for the electroless copper plating, electroless copper may be deposited on the solder resist. If this is the case, a further resist patterned as the solder resist can be applied to prevent such deposition. The layer 14 of copper is then coated with a tin-lead alloy layer 15 (FIG. 11), for example, by roller-tinning, solder levelling, immersion, or electroless plating. The solder resist 13 may then be removed if desired. The tin-lead layer, such as 15, thus provided on those parts which are to be soldered, thus ensures good solderability without the need for an activated flux. Thus there can be provided a printed circuit board with all the advantages of a palladium-nickel, or other nickel alloy, finish on the tracks and connector areas plus the solderability of a conventional tin-lead finished board.

Alternatively, other methods of preserving the good solderability of the copper, such as the use of a flux compatible lacquer or tin-plating, for example, may be used. If the board is to be hand soldered so soon after its manufacture that oxidation or corrosion of the copper can be ignored, the copper layer 14 may be left uncovered. Preferably, however, the finish is a tin-lead alloy coating. On very small or thin soldered joints, the nickel alloy layer beneath the solderable copper plating on the pads and hole walls acts as a diffusion barrier and prevents the long term migration of tin out of the solder in the joint. This tin migration is a cause of joint failures over long periods at elevated temperatures and the use of a diffusion barrier of a metal such as nickel is a known cure when the joints must be small, especially in the case of joints made by reflowing tin-lead on pads on the surfaces of a board. The amount of diffusion of tin into the copper layer 14 can be controlled by adjusting the thickness of layer 14 to suit the volume of the solder joint to be made on the copper. That is, the larger the joint, the thicker the copper layer 14 employed.

Although FIGS. 2 to 12 illustrates only one surface 2 of the substrate 2 and the related description only refers to that surface, it goes without saying that the description might alternatively or additionally apply to the other substrate face. The thickness of the various layers in the drawings are exaggerated for clarity. Whereas the description specifically refers to printed circuits with through holes, it may alternatively be applied to circuits without such holes. Whereas the above description refers to the use of positive photo-resists, which are applied by roller-coating and thus liquid initially, negative-working resists can alternatively be employed, and instead of liquid photo-resists dry film resists may be used. In addition, whereas the method described above involves total removal of the remaining photo-resist 7 after nickel-alloy plating, in a variation of that method double-exposure of the photo-resist may be employed so that only portions of the remaining photo-resist 7 are removed, the then remaining portions of the photo-resist can thus act as a partial replacement for the solder resist 13.

What is claimed is:

1. A printed circuit board comprising:
   an insulating substrate with at least one hole extending therethrough, the substrate forming a wall surface of the hole;
   conductive areas provided on one or more surfaces of the insulating substrate, the conductive areas comprising a first copper layer on the substrate and on the hole wall surface, and a palladium-nickel alloy layer on the first copper layer, the palladium-nickel alloy layer during manufacture of the circuit board comprising an etch resist for the first copper layer; and
   a second copper layer on the palladium-nickel alloy layer on at least one of said areas to enable a solder joint containing tin to be made at said at least one area, the palladium-nickel alloy at said at least one area serving to limit the diffusion of tin into the first copper layer from such solder joint, and the thickness of the second copper layer being determined in accordance with the volume of the solder joint to be made, said thickness being greater for a large volume solder joint than for a small volume solder joint to control the diffusion of said tin into the second copper layer.

2. A printed circuit board as claimed in claim 1, wherein the second copper layer is treated whereby to preserve its solderability.

3. A printed circuit board as claimed in claim 2, where the second copper layer is coated with a flux compatible lacquer.

4. A printed circuit board as claimed in claim 2, wherein the second copper layer is tin plated.

5. A printed circuit board as claimed in claim 2, wherein the second copper layer is tin-lead coated.

6. A printed circuit board as claimed in claim 1, wherein said conductive areas comprise conductive tracks which are finished by the palladium-nickel alloy.

7. A printed circuit board as claimed in claim 6, including a layer of solder resist extending over said conductive tracks.

8. A method of manufacturing a printed circuit board comprising the steps of:
   selectively plating areas of a first copper layer-coated insulating substrate with a palladium-nickel alloy, the insulating substrate having at least one hole extending therethrough, the hole wall surface being coated by the first copper layer and said areas including the copper-coated hole wall surface;
   employing the palladium-nickel alloy as an etch resist to protect said areas;
   etching the first copper layer from the substrate except in said areas protected by said palladium-nickel alloy, or in other areas protected by another etch resistant layer; and
   depositing a second copper layer on at least one of said palladium-nickel alloy plated areas to enable a solder joint containing tin to be made thereto, the palladium-nickel alloy at said at least one area serving to limit the diffusion of tin into the first copper layer from such solder joint, and wherein said depositing comprises controlling the thickness of the second copper layer in accordance with the volume of the solder joint to be made, said thickness being greater for a large volume solder joint than for a small volume solder joint to control the diffusion of said tin into the second copper layer.

9. A method as claimed in claim 2, wherein the second copper layer is deposited by an electroless plating process.

10. A method as claimed in claim 9, wherein the second copper layer is deposited by an autocatalytic electroless plating process.

11. A method as claimed in claim 2, further comprising preserving the solderability of the deposited copper layer.

12. A method as claimed in claim 2, further comprising tin-lead coating the deposited copper layer.

* * * * *

UNITED STATES PATENT AND TRADEMARK OFFICE
CERTIFICATE OF CORRECTION

PATENT NO. : 4,572,925
DATED : February 25, 1986
INVENTOR(S) : Scarlett

It is certified that error appears in the above-identified patent and that said Letters Patent is hereby corrected as shown below:

Column 4 (claim 3) line 60, "where should be --wherein--;
Column 6 (claim 9) line 10, "claim 2" should be --claim 8--;
Column 6 (claim 10) line 16, "claim 2" should be --claim 8--;
Column 6 (claim 12) line 19, "claim 2" should be --claim 8--;

Signed and Sealed this

Twenty-ninth Day of July 1986

[SEAL]

Attest:

Attesting Officer

DONALD J. QUIGG

Commissioner of Patents and Trademarks